(12) United States Patent
Chen et al.

(10) Patent No.: US 11,101,647 B1
(45) Date of Patent: Aug. 24, 2021

(54) OVERVOLTAGE PROTECTION CIRCUIT

(71) Applicant: Global Mixed-mode Technology Inc., Hsin-Chu (TW)

(72) Inventors: Wei-Yu Chen, New Taipei (TW); Guang-Nan Tzeng, Hsinchu (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 0 days.

(21) Appl. No.: 16/933,969

(22) Filed: Jul. 20, 2020

(51) Int. Cl.
| | | |
|---|---|---|
| *H02H 3/20* | (2006.01) | |
| *H02H 9/04* | (2006.01) | |
| *H03K 17/687* | (2006.01) | |
| *G01R 19/165* | (2006.01) | |
| *H03K 17/0812* | (2006.01) | |
| *H03K 5/24* | (2006.01) | |

(52) U.S. Cl.
CPC ....... *H02H 9/042* (2013.01); *G01R 19/16538* (2013.01); *H02H 3/20* (2013.01); *H02H 9/044* (2013.01); *H03K 5/24* (2013.01); *H03K 17/08122* (2013.01); *H03K 17/6871* (2013.01)

(58) Field of Classification Search
CPC .......... H02H 9/04; H02H 9/042; H02H 9/045; H02H 7/08; H02H 7/09; H02H 7/085; H02H 3/20; H02H 3/08; H02H 3/18; B60R 16/03; H02P 3/14; H03K 19/075; H03K 17/6871; G01R 19/16538
USPC ............................................. 361/86–87, 91.1
See application file for complete search history.

(56) References Cited

U.S. PATENT DOCUMENTS

| | | | |
|---|---|---|---|
| 6,713,979 B2* | 3/2004 | Naito ........................ | H02P 6/24 318/280 |
| 2008/0068770 A1 | 3/2008 | Kiuchi | |
| 2009/0135531 A1 | 5/2009 | Hirata | |
| 2018/0375321 A1* | 12/2018 | Ehrhart ................ | H02H 7/0838 |

FOREIGN PATENT DOCUMENTS

| | | |
|---|---|---|
| CN | 110535401 A | 12/2019 |
| CN | 110557106 A | 12/2019 |
| TW | 201110532 A1 | 3/2011 |
| TW | 201728031 A | 8/2017 |

* cited by examiner

*Primary Examiner* — Danny Nguyen
(74) *Attorney, Agent, or Firm* — Winston Hsu

(57) ABSTRACT

An overvoltage protection circuit which can be applied to a motor controller is provided. The overvoltage protection circuit comprises a voltage controller, a comparator, and a switching circuit so as to prevent damage to a driving circuit. The driving circuit is configured to supply a driving current to a motor coil.

20 Claims, 3 Drawing Sheets

OVERVOLTAGE PROTECTION CIRCUIT

BACKGROUND OF THE INVENTION

1. Field of the Invention

The present invention relates to an overvoltage protection circuit, and more particularly, to an overvoltage protection circuit which can be applied to a motor controller.

2. Description of the Prior Art

FIG. 1 is a circuit diagram showing a conventional motor controller 10. The motor controller 10 is used for driving a motor, where the motor has a motor coil L. The motor controller 10 comprises a driving circuit 100 and a controller 110. The driving circuit 100 includes a transistor 101, a transistor 102, a transistor 103, and a transistor 104. When the motor is configured to operate in a forward direction, the transistor 101 and the transistor 104 are turned on while the transistor 102 and the transistor 103 are turned off. The current of the motor coil L flows sequentially from the terminal Vm to the transistor 101, the first terminal O1, the second terminal O2, the transistor 104, and the terminal GND. When the motor is configured to brake or operate in a reverse direction, the transistor 102 and the transistor 103 are turned on while the transistor 101 and the transistor 104 are turned off, so as to decrease the current of the motor coil L or change the current direction of the motor coil L. At this moment the current of the motor coil L keeps flowing at the same direction due to the inductor effect or the inertia motion, resulting that the current of the motor coil L flows sequentially from the terminal GND to the transistor 102, the first terminal O1, the second terminal O2, the transistor 103, and the terminal Vm. Finally, the voltage of the terminal Vm will be increased. If the voltage of the terminal Vm is greater than the withstand voltage of the driving circuit 100 and the controller 110, the driving circuit 100 and the controller 110 may be damaged.

Thus, what is needed is the overvoltage protection circuit which is capable of protecting the circuit from damage.

SUMMARY OF THE INVENTION

According to the present invention, an overvoltage protection circuit which can be applied to a motor controller is provided. The overvoltage protection circuit comprises a voltage controller, a comparator, and a switching circuit so as to prevent damage to a driving circuit. The driving circuit is configured to supply a driving current to a motor coil.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION

Preferred embodiments according to the present invention will be described in detail with reference to the drawings.

Figure 1:
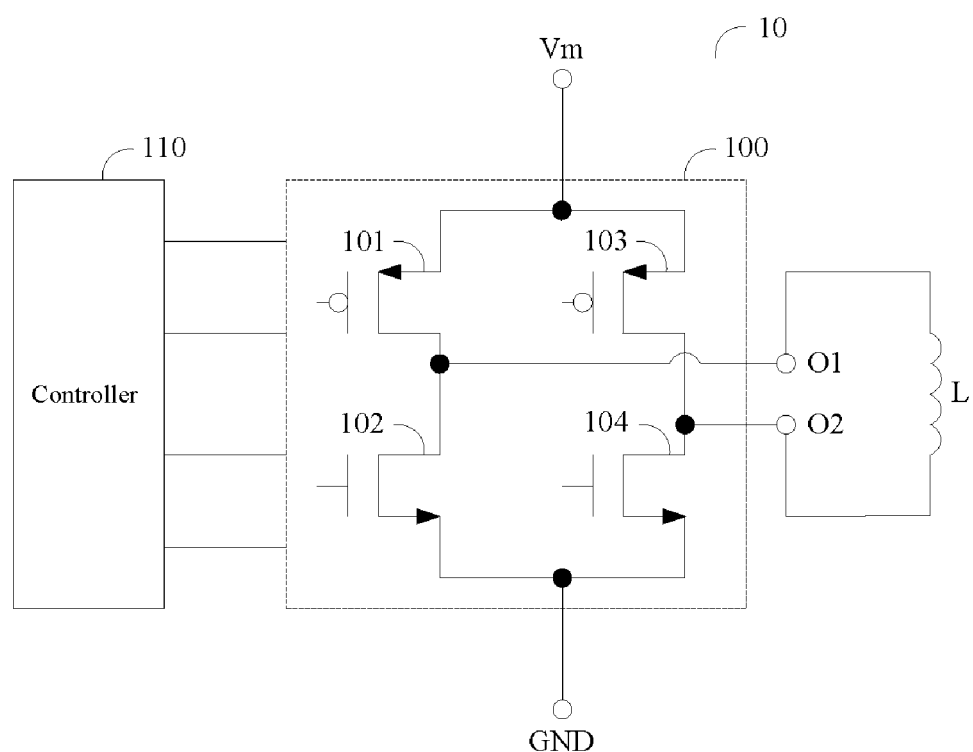
FIG. 1 is a circuit diagram showing a conventional motor controller.
Figure 2:
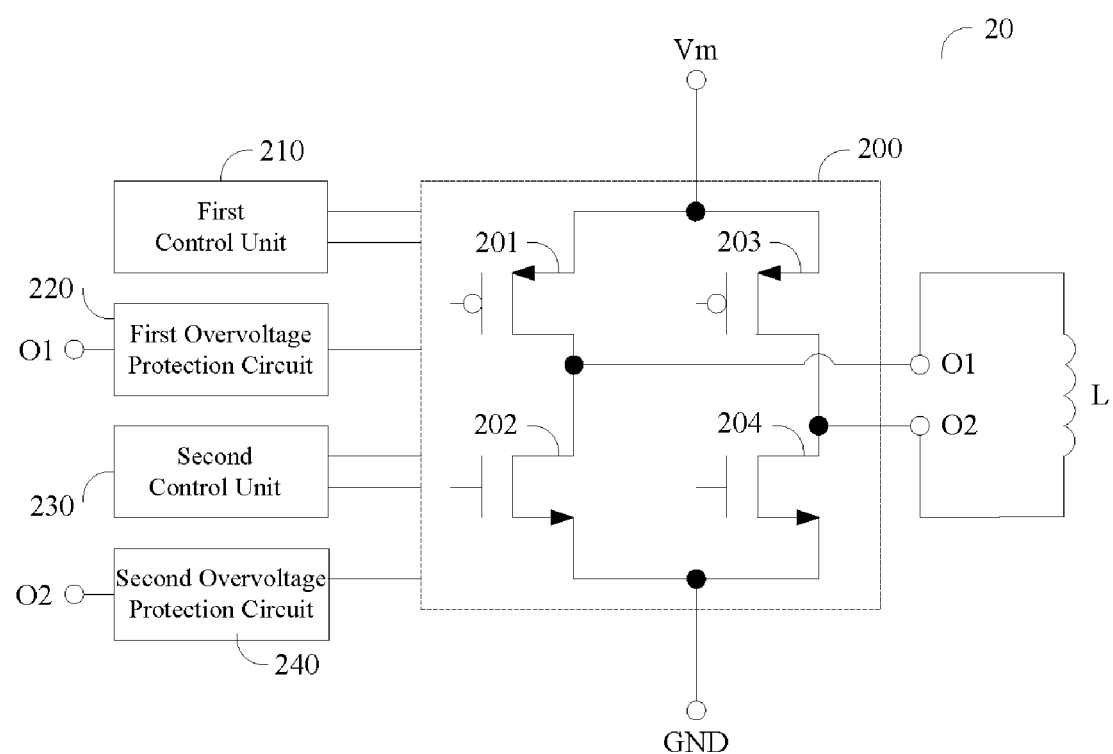
FIG. 2 is a circuit diagram showing a motor controller according to one embodiment of the present invention.

FIG. 2 is a circuit diagram showing a motor controller 20 according to one embodiment of the present invention. The motor controller 20 is used for driving a motor, where the motor has a motor coil L. The motor controller 20 comprises a driving circuit 200, a first control unit 210, a first overvoltage protection circuit 220, a second control unit 230, and a second overvoltage protection circuit 240.

The driving circuit 200 includes a transistor 201, a transistor 202, a transistor 203, and a transistor 204 for supplying a driving current to the motor coil L, where a supply voltage is used for supplying the voltage of the driving circuit 200. The motor coil L has a first terminal O1 and a second terminal O2. The transistor 201 is coupled to the first terminal O1 and a terminal Vm. The transistor 202 is coupled to the first terminal O1 and a terminal GND. The transistor 203 is coupled to the second terminal O2 and the terminal Vm. The transistor 204 is coupled to the second terminal O2 and the terminal GND. Transistors 201-204 may be respectively a p-type MOSFET or an n-type MOSFET. As shown in FIG. 2, each of the transistor 201 and the transistor 203 may be a p-type MOSFET, while each of the transistor 202 and the transistor 204 may be an n-type MOSFET.

The first control unit 210 is used to control the on/off states of the transistor 201 and the transistor 202, while the second control unit 230 is used to control the on/off states of the transistor 203 and the transistor 204. The first overvoltage protection circuit 220 is coupled to the first terminal O1 for limiting the voltage of the terminal Vm, so as to protect the driving circuit 200. Similarly, the second overvoltage protection circuit 240 is coupled to the second terminal O2 for limiting the voltage of the terminal Vm, so as to protect the driving circuit 200. More specifically, when the transistor 204 is switching from the on state to the off state by the second control unit 230 and the voltage of the second terminal O2 is greater than the supply voltage, the transistor 204 will be turned on slightly so as to control the current flowing to the terminal GND instead of flowing to the terminal Vm. When the current no longer flows to the terminal Vm, the voltage of the terminal Vm will not be large enough to damage the driving circuit 200.

Figure 3:
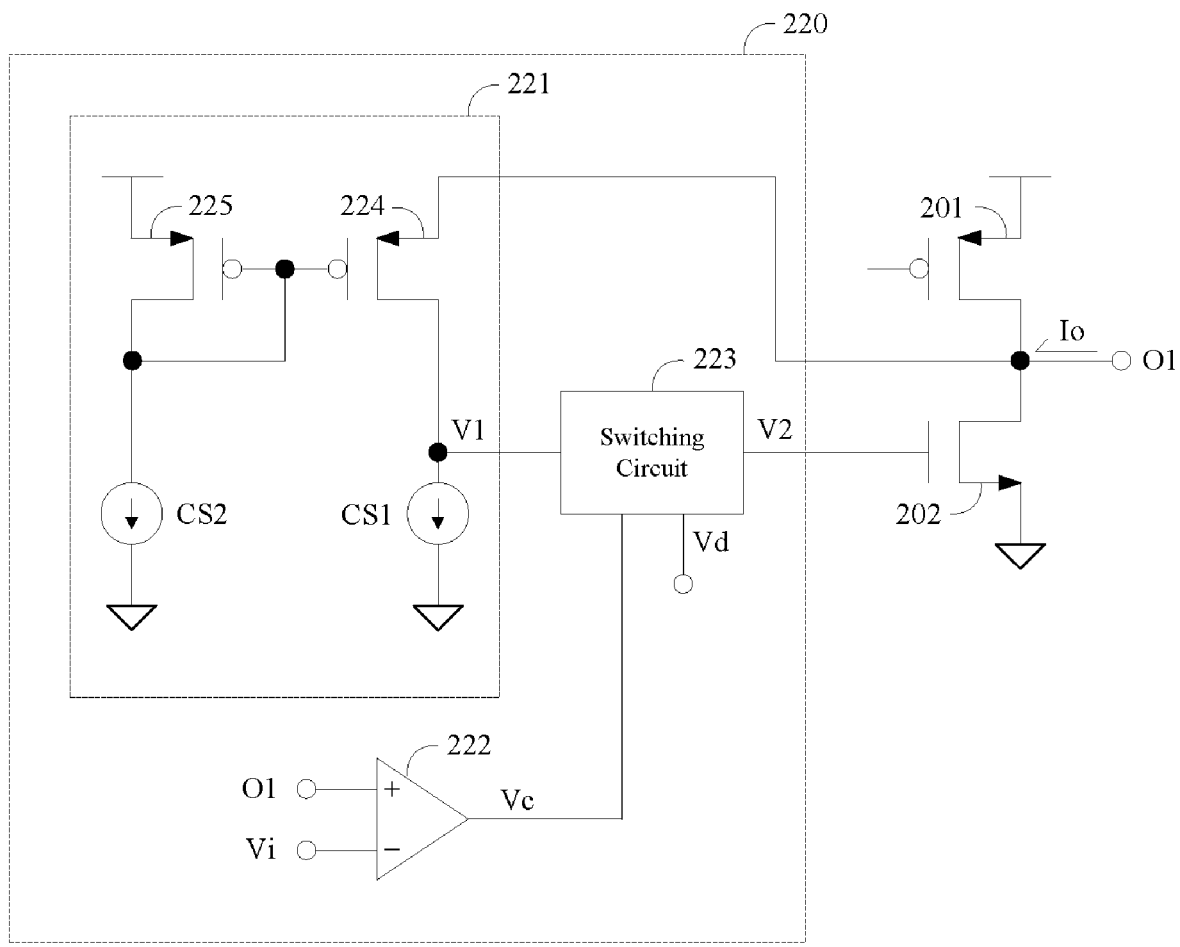
FIG. 3 is a circuit showing a first overvoltage protection circuit according to one embodiment of the present invention.

FIG. 3 is a circuit showing the first overvoltage protection circuit 220 according to one embodiment of the present invention. The first overvoltage protection circuit 220 comprises a voltage controller 221, a comparator 222, and a switching circuit 223. The voltage controller 221 comprises a transistor 224, a transistor 225, a first current source CS1, and a second current source CS2, where each of the transistor 224 and the transistor 225 are a p-type MOSFET. The transistor 224 is coupled to the first terminal O1, the transistor 201, the transistor 202, and a first current source CS1, so as to generate a first signal V1 to the switching circuit 223. The transistor 225 is coupled to a voltage source, a second current source CS2, and the transistor 224, where the size of the transistor 224 is identical to the size of the transistor 225. The comparator 222 compares the voltage of the first terminal O1 and an input voltage Vi for generating a control signal Vc to the switching circuit 223. Based on the different detecting times, the input voltage Vi may be the supply voltage, the supply voltage plus a first reference voltage, or the supply voltage minus a second reference voltage. The first reference voltage is less than or equal to 0.4 volts. The second reference voltage is less than or equal to 0.4 volts. The switching circuit 223 receives the first signal V1, the control signal Vc, and a detecting signal Vd, so as to generate a second signal V2 to the transistor 202.

More specifically, when the output current Io flowing from the motor coil L to the first terminal O1 is greater than 0 and the voltage of the first terminal O1 is greater than the supply voltage, the control signal Vc is at a high level H, so that the second signal V2 is coupled to the first signal V1 for controlling the transistor 202. If the voltage of the first terminal O1 increases, the first signal V1 and the second signal V2 will increase accordingly, thereby turning on the transistor 202 and making the transistor 202 operate in a saturation region, so as to enter an overvoltage protection mechanism. At this moment the output current Io flows to the terminal GND via the transistor 202. The voltage of the first terminal O1 decreases for preventing damage to the driving circuit 200. When the second signal V2 is less than a third reference voltage or the output current Io is less than a reference current, the detecting signal Vd is at the high level H, so that the second signal V2 is at a low level L for turning off the transistor 202 and leaving the overvoltage protection mechanism. Since the structure of the second overvoltage protection circuit 240 is similar to the structure of the first overvoltage protection circuit 220, the operation method regarding the second overvoltage protection circuit 240 will not be mentioned.

The first overvoltage protection circuit 220 can be applied to a single-phase or polyphase configuration. Also, the first overvoltage protection circuit 220 can be applied to an inductive actuator, such as a brushless motor, a DC motor, a voice coil motor, or an electromagnetic actuator. Since it is needless to implement an operation amplifier and a frequency compensation circuit, it is simpler for circuit design and the cost of the manufacturing process can be reduced.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overvoltage protection circuit configured to protect a driving circuit, wherein the driving circuit is configured to supply a driving current to a motor coil and the motor coil has a first terminal and a second terminal, and the overvoltage protection circuit comprises:
   a voltage controller, coupled to the first terminal for generating a first signal;
   a comparator, configured to generate a control signal based on a voltage of the first terminal; and
   a switching circuit, configured to receive the first signal and the control signal, so as to generate a second signal to the driving circuit, wherein the control signal is configured to determine if the second signal is coupled to the first signal.

2. The overvoltage protection circuit of claim 1, wherein the comparator is configured to compare the voltage of the first terminal and an input voltage.

3. The overvoltage protection circuit of claim 2, wherein the driving circuit comprises:
   a first transistor, coupled to the first terminal and a third terminal; and
   a second transistor, coupled to the first terminal and a fourth terminal, wherein a supply voltage is configured to supply a voltage of the driving circuit.

4. The overvoltage protection circuit of claim 3, wherein the driving circuit further comprises:
   a third transistor, coupled to the second terminal and the third terminal; and
   a fourth transistor, coupled to the second terminal and the fourth terminal.

5. The overvoltage protection circuit of claim 4, wherein each of the first transistor and the third transistor is a p-type MOSFET.

6. The overvoltage protection circuit of claim 5, wherein each of the second transistor and the fourth transistor is an n-type MOSFET.

7. The overvoltage protection circuit of claim 3, wherein the input voltage is equal to the supply voltage.

8. The overvoltage protection circuit of claim 3, wherein the input voltage is equal to the supply voltage plus a first reference voltage.

9. The overvoltage protection circuit of claim 8, wherein the first reference voltage is less than or equal to 0.4 volts.

10. The overvoltage protection circuit of claim 3, wherein the input voltage is equal to the supply voltage minus a second reference voltage.

11. The overvoltage protection circuit of claim 10, wherein the second reference voltage is less than or equal to 0.4 volts.

12. The overvoltage protection circuit of claim 3, wherein the second signal is configured to control the second transistor.

13. The overvoltage protection circuit of claim 12, wherein the second transistor is turned on when entering an overvoltage protection mechanism.

14. The overvoltage protection circuit of claim 13, wherein the second transistor is operated in a saturation region.

15. The overvoltage protection circuit of claim 13, wherein when a voltage of the second signal is less than a third reference voltage, the second transistor is turned off so as to leave the overvoltage protection mechanism.

16. The overvoltage protection circuit of claim 13, wherein when an output current flowing from the motor coil to the first terminal is less than a reference current, the second transistor is turned off so as to leave the overvoltage protection mechanism.

17. The overvoltage protection circuit of claim 1, wherein the overvoltage protection circuit can be applied to a single-phase or polyphase configuration.

18. The overvoltage protection circuit of claim 1, wherein the voltage controller comprises:
   a fifth transistor; and
   a first current source, coupled to the fifth transistor for generating the first signal.

19. The overvoltage protection circuit of claim 18, wherein the voltage controller further comprises:
   a sixth transistor, coupled to the fifth transistor; and
   a second current source, coupled to the sixth transistor.

20. The overvoltage protection circuit of claim 19, wherein the fifth transistor is coupled to the first terminal and the sixth transistor is coupled to a voltage source.

\* \* \* \* \*